(12) United States Patent
Huang et al.

(10) Patent No.: US 11,462,467 B2
(45) Date of Patent: Oct. 4, 2022

(54) LEAD FRAME, PACKAGE STRUCTURE COMPRISING THE SAME AND METHOD FOR MANUFACTURING THE PACKAGE STRUCTURE

(71) Applicant: Advanced Semiconductor Engineering, Inc., Kaohsiung (TW)

(72) Inventors: Chia Hsiu Huang, Kaohsiung (TW); Chun Chen Chen, Kaohsiung (TW); Wei Chih Cho, Kaohsiung (TW); Shao-Lun Yang, Kaohsiung (TW); Yu-Shun Hsieh, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 87 days.

(21) Appl. No.: 16/929,018

(22) Filed: Jul. 14, 2020

(65) Prior Publication Data
US 2022/0020680 A1    Jan. 20, 2022

(51) Int. Cl.
| | |
|---|---|
| *H01L 23/498* | (2006.01) |
| *H01L 21/48* | (2006.01) |
| *H01L 23/31* | (2006.01) |
| *H01L 23/00* | (2006.01) |
| *H01L 23/495* | (2006.01) |

(52) U.S. Cl.
CPC .... *H01L 23/49861* (2013.01); *H01L 21/4825* (2013.01); *H01L 21/4839* (2013.01); *H01L 21/4853* (2013.01); *H01L 23/3121* (2013.01); *H01L 23/4952* (2013.01); *H01L 23/49548* (2013.01); *H01L 23/49811* (2013.01); *H01L 24/45* (2013.01); *H01L 2224/48245* (2013.01)

(58) Field of Classification Search
CPC .................................................. H01L 23/495
See application file for complete search history.

(56) References Cited

U.S. PATENT DOCUMENTS

2013/0285222 A1*  10/2013  Park ................. H01L 23/49586
257/676

\* cited by examiner

*Primary Examiner* — Yu-Hsi D Sun
(74) *Attorney, Agent, or Firm* — Foley & Lardner LLP

(57) ABSTRACT

A lead frame includes a die paddle and a plurality of leads. The leads surround the die paddle. Each of the leads includes an inner lead portion and an outer lead portion connecting to the inner lead portion. The inner lead portion is adjacent to and spaced apart from the die paddle. A bottom surface of the inner lead portion is higher than a bottom surface of the outer lead portion. The bottom surface of the inner lead portion includes one or more supporting members disposed thereon. The one or more supporting members have a convex surface facing away from the inner lead portion.

19 Claims, 13 Drawing Sheets

US 11,462,467 B2

LEAD FRAME, PACKAGE STRUCTURE COMPRISING THE SAME AND METHOD FOR MANUFACTURING THE PACKAGE STRUCTURE

BACKGROUND

1. Field of the Disclosure

The present disclosure relates to a lead frame including a plurality of leads surrounding a die paddle and a package structure including the lead frame, and to a method for manufacturing the package structure.

2. Description of the Related Art

For semiconductor devices such as quad flat non-leaded package (QFN), it is desirable to increase a length of the leads so that the leads can be as close to the semiconductor die as possible, thereby reducing the length of the bonding wire connecting the leads and the semiconductor die.

SUMMARY

In some embodiments, a lead frame includes a die paddle and a plurality of leads. The leads surround the die paddle. Each of the leads includes an inner lead portion and an outer lead portion connecting to the inner lead portion. The inner lead portion is adjacent to and spaced apart from the die paddle. A bottom surface of the inner lead portion is higher than a bottom surface of the outer lead portion. The bottom surface of the inner lead portion includes one or more supporting members disposed thereon. The one or more supporting members have a convex surface facing away from the inner lead portion.

In some embodiments, a package structure includes a die paddle, a semiconductor die, a plurality of leads, and an encapsulant. The semiconductor die is disposed on the die paddle. The leads surround the die paddle. Each of the leads includes an inner lead portion and an outer lead portion connecting to the inner lead portion. The inner lead portion is adjacent to and spaced apart from the die paddle. A bottom surface of the inner lead portion is higher than a bottom surface of the outer lead portion. The bottom surface of the inner lead portion includes one or more supporting members disposed thereon. The one or more supporting members have a convex surface facing away from the inner lead portion. The encapsulant covers the semiconductor die, the die paddle, the leads and the one or more supporting members.

In some embodiments, a method for manufacturing a package structure includes: (a) providing a lead frame comprising a die paddle and a plurality of leads surrounding the die paddle, each of the leads including an inner lead portion and an outer lead portion connecting to the inner lead portion, wherein the inner lead portion is adjacent to and spaced apart from the die paddle, a bottom surface of the inner lead portion is higher than a bottom surface of the outer lead portion; and (b) forming one or more supporting members to a bottom surface of the inner lead portion of each lead.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

FIG. 5 is a partially enlarged view of two adjacent leads according to some embodiments of the present disclosure.

DETAILED DESCRIPTION

Figure 1:
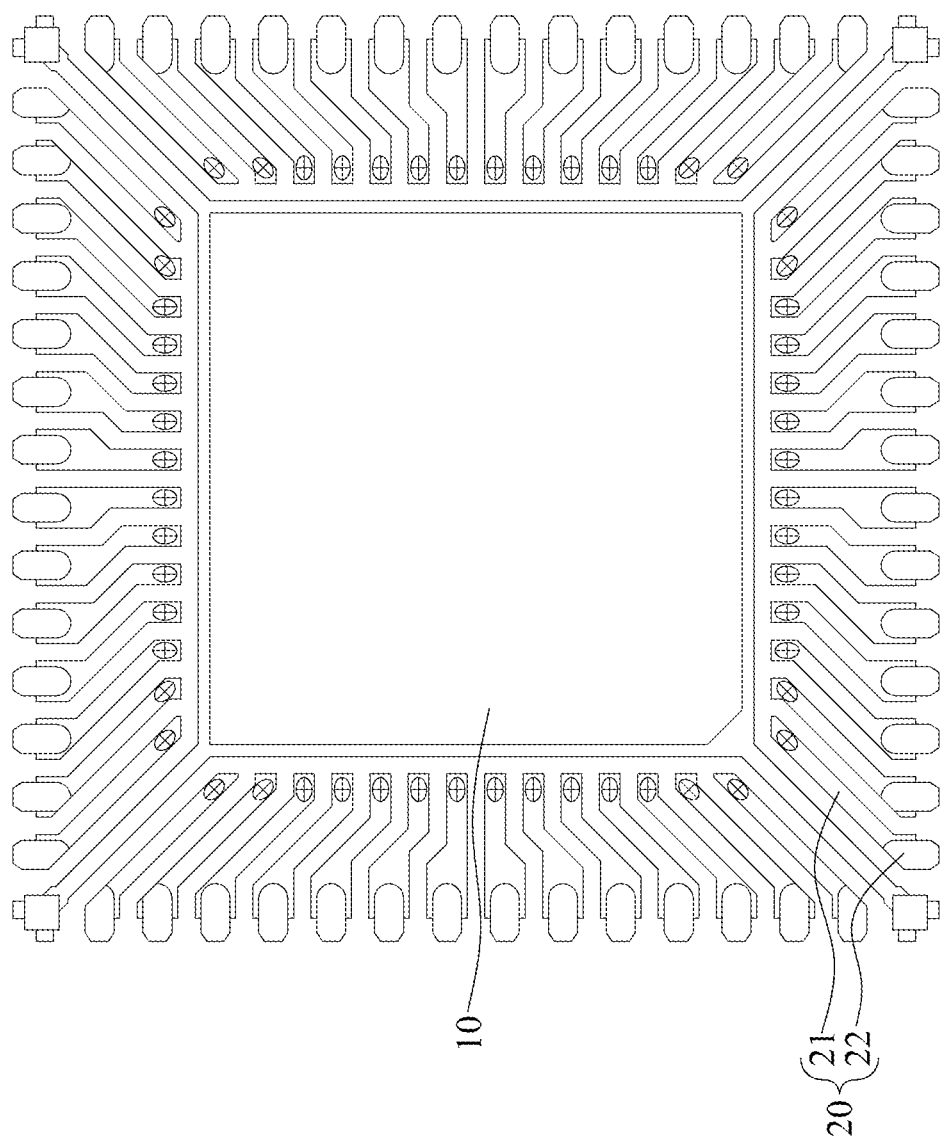
FIG. 1 illustrates a bottom view of a lead frame according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In the existing techniques, a lead frame includes a die paddle and a plurality of leads, each of the leads including an inner lead and an outer lead. The outer lead may be electrically connected to an external circuit and the inner lead may be electrically connected to a semiconductor die disposed on the die paddle. To prevent an inner lead from exposure to the external environment, the thickness of the inner lead may be reduced so that the encapsulant can fully cover the inner lead. However, the thinning process weakens the structural strength of the inner lead. In addition, when the length of the inner lead is increased, it is likely that the thinned inner lead may shake or deform during a wire bonding process, which results in the exposure of the inner lead to the external environment, or may cause breakage of the bonding wires. In comparative examples, an end of the inner lead is not subjected to the thinning process so that it can contact a table of a wire bonding machine during a wire bonding process and prevent the inner lead from shaking or deformation. The end of the inner lead can be thinned in a subsequent process. However, since the end of the inner lead should remain thick during the thinning process, it is difficult to produce individual inner leads with an inner lead pitch of 0.3 mm or less.

The lead frame structure according to the present disclosure includes one or more supporting members attached to the bottom surface(s) of the inner lead portions. The supporting member is applied after the thinning process and retained as a part of the lead frame structure after the wire bonding process. The supporting member can support the bonding end of the lead and prevent the lead from shaking or deformation during a wire bonding process. Accordingly, the length of the lead can be increased. In addition, the thickness of the inner lead portion (including the end of the inner lead portion) can be reduced so that a lead frame structure with an inner lead pitch of 0.3 mm or less can be obtained.

Figure 2:
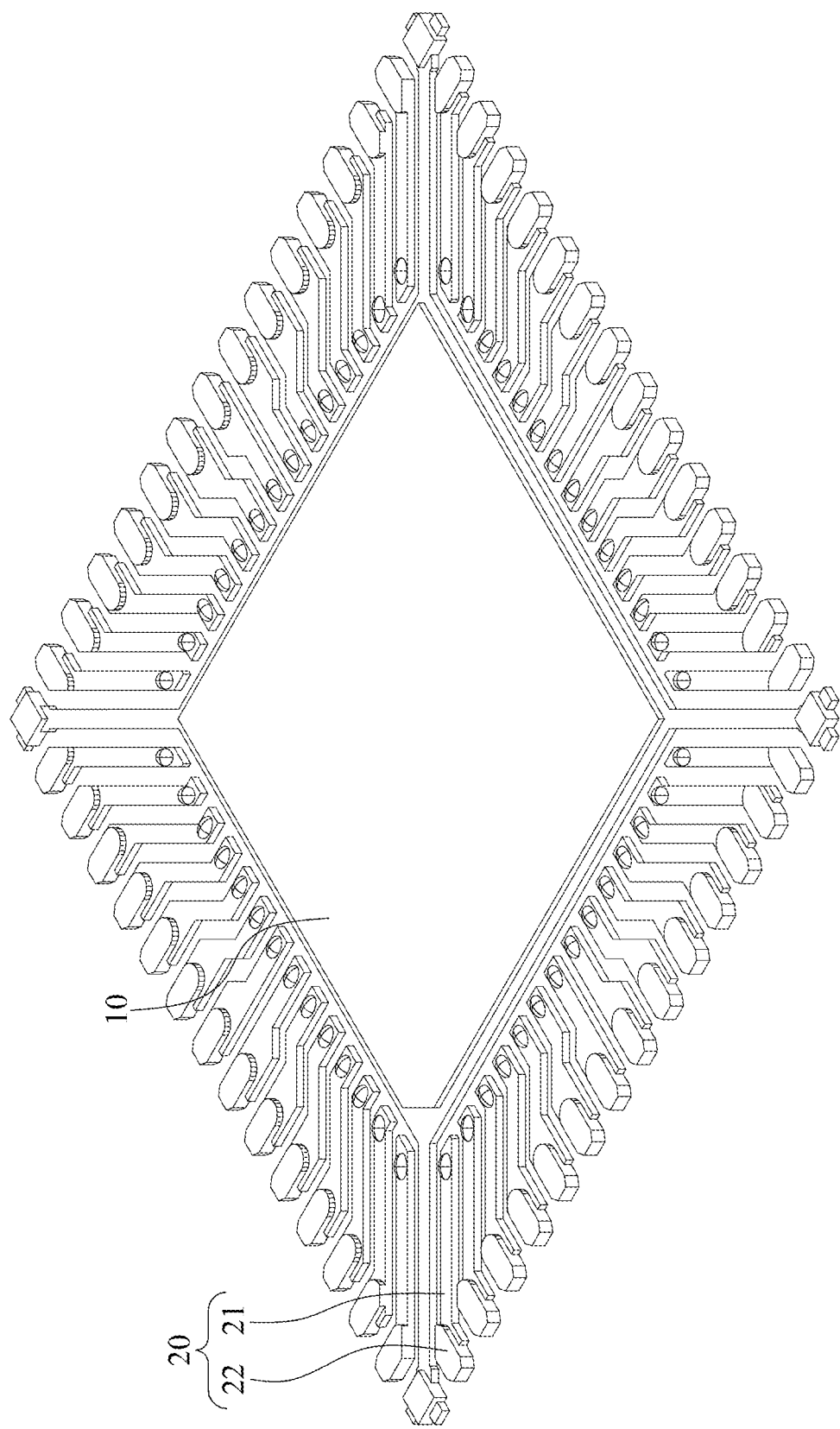
FIG. 2 illustrates a bottom perspective view of the lead frame of FIG. 1.
Figure 3:
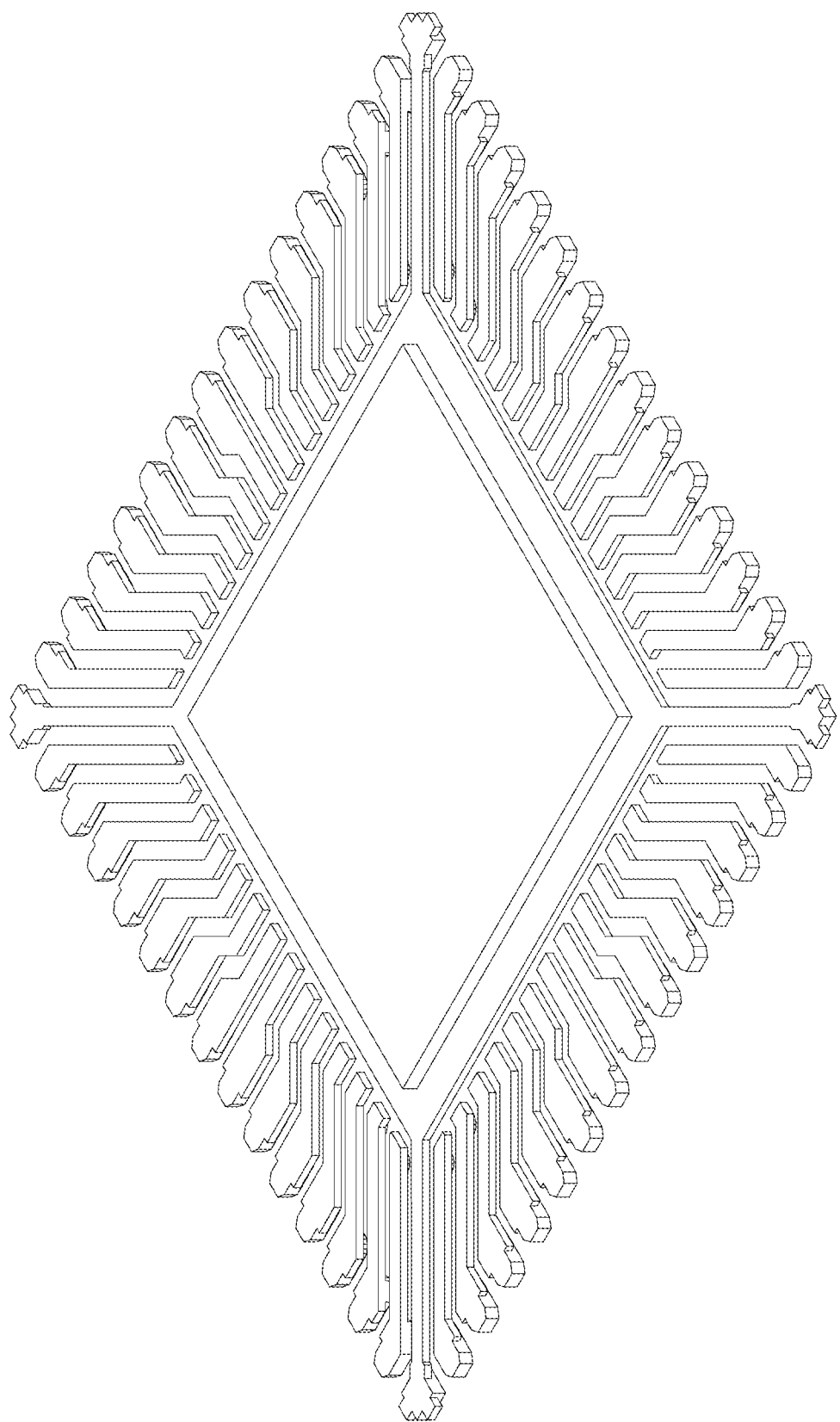
FIG. 3 illustrates a top perspective view of the lead frame of FIG. 1.

FIG. 1 illustrates a bottom view of a lead frame 1 according to some embodiments of the present disclosure. FIG. 2 illustrates a bottom perspective view of the lead frame 1 of FIG. 1. FIG. 3 illustrates a top perspective view of the lead frame 1 of FIG. 1. Referring to FIGS. 1-3, the lead frame 1 includes a die paddle 10 and a plurality of leads 20 surrounding the die paddle 10.

Figure 4:
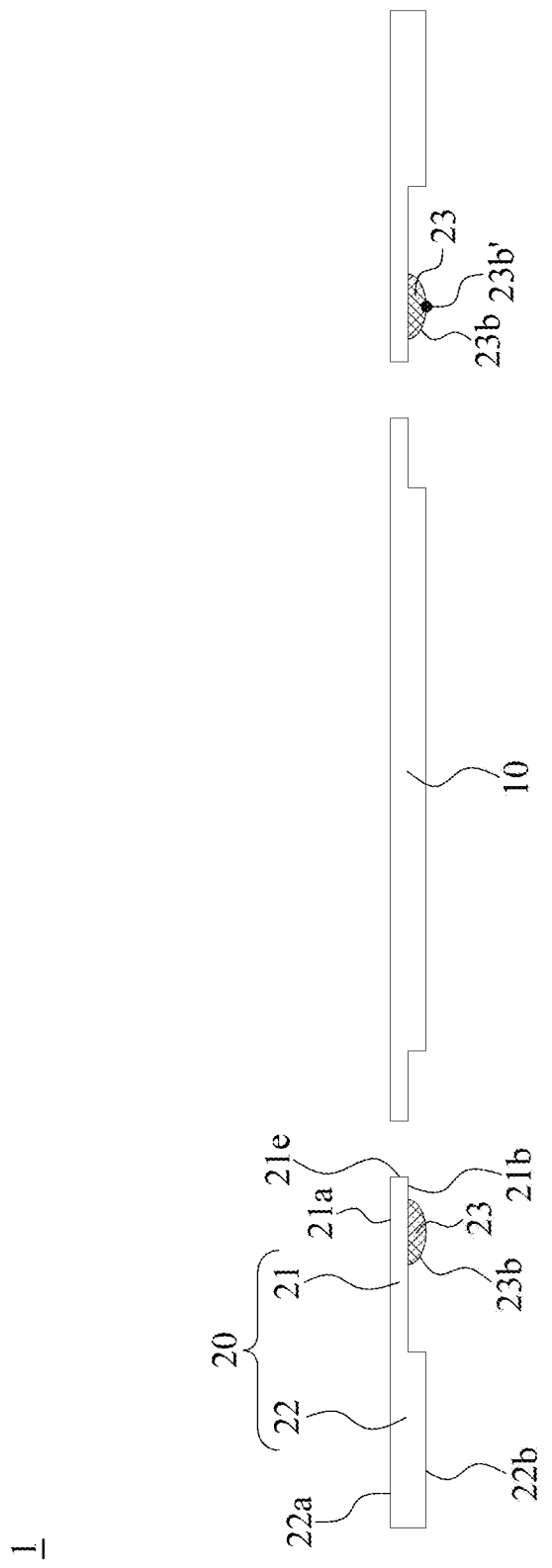
FIG. 4 illustrates a cross-sectional view of the lead frame of FIG. 3.

FIG. 4 illustrates a cross-sectional view of FIG. 3. Referring to FIGS. 1 and 4, each of the leads 20 includes an inner lead portion 21 and an outer lead portion 22 connecting to the inner lead portion 21. The inner lead portion 21 is adjacent to and spaced apart from the die paddle 10. In some embodiments, the inner lead portion 21 and the outer lead portion 22 are formed integrally (and, e.g., concurrently) as a monolithic structure. That is, each of the leads 20 may be a monolithic structure.

The inner lead portion 21 has an upper surface 21a and a lower surface 21b. The outer lead portion 22 has an upper surface 22a and a lower surface 22b. In some embodiments, the upper surface 21a of the inner lead portion 21 is substantially coplanar with the upper surface 22a of the outer lead portion 22. The upper surface 21a of the inner lead portion 21 may be a place for receiving an end of a bonding wire. That is, the end of the bonding wire is connected or bonded to the upper surface 21a of the inner lead portion 21. The lower surface 21b of the inner lead portion 21 is higher than the lower surface 22b of the outer lead portion 22. The inner lead portion 21 has a smaller thickness than the outer portion 22. The lower surface 21b of the inner lead portion 21 includes one or more supporting members 23 disposed thereon. In some embodiments, the term "upper surface" used hereinbefore and hereinafter may refer to "top surface," and the term "lower surface" used hereinbefore and hereinafter may refer to "bottom surface."

The supporting member 23 has a convex surface 23b facing away from the inner lead portion 21. The supporting member 23 may contact a table of a wire bonding machine during a wire bonding process. In some embodiments, a top 23b' of the convex surface 23b of the supporting member 23 may be higher than the lower surface 22b of the outer lead portion 22. In some embodiments, a top 23b' of the convex surface 23b of the supporting member 23 is substantially coplanar with the lower 22b surface of the outer lead portion 22. In some embodiments, a top 23b' of the convex surface 23b of the supporting member 23 may be lower than the lower 22b surface of the outer lead portion 22.

The supporting member 23 is disposed on the lower surface 21b of the inner lead portion 21 and close to a distal end 21e of the inner lead portion 21. The distal end of the inner lead portion 21 refers to an end of the inner lead portion away from or distal to the outer lead portion 22. In some embodiments, the supporting member is disposed on the lower surface 21b of the inner lead portion 21 and directly below a region on the upper surface 21a of the inner lead portion 21 for receiving an end of a bonding wire.

A material of the supporting member 23 is different from a material of the inner lead portion 21. Therefore, there is an interface formed between the supporting member 23 and the inner lead portion 21. In some embodiments, the inner lead portion 21 can be made of metal, e.g., copper. In some embodiments, the supporting member 23 is a solder resist coating.

The supporting member 23 may improve the structural strength of the lead 20, thereby allowing the length of the lead 20 to be increased; for example, a length of the inner lead portion 21 may be increased to greater than about 2.3 mm, about 2.5 mm, about 3 mm, about 5 mm, or about 8 mm.

Figure 5:
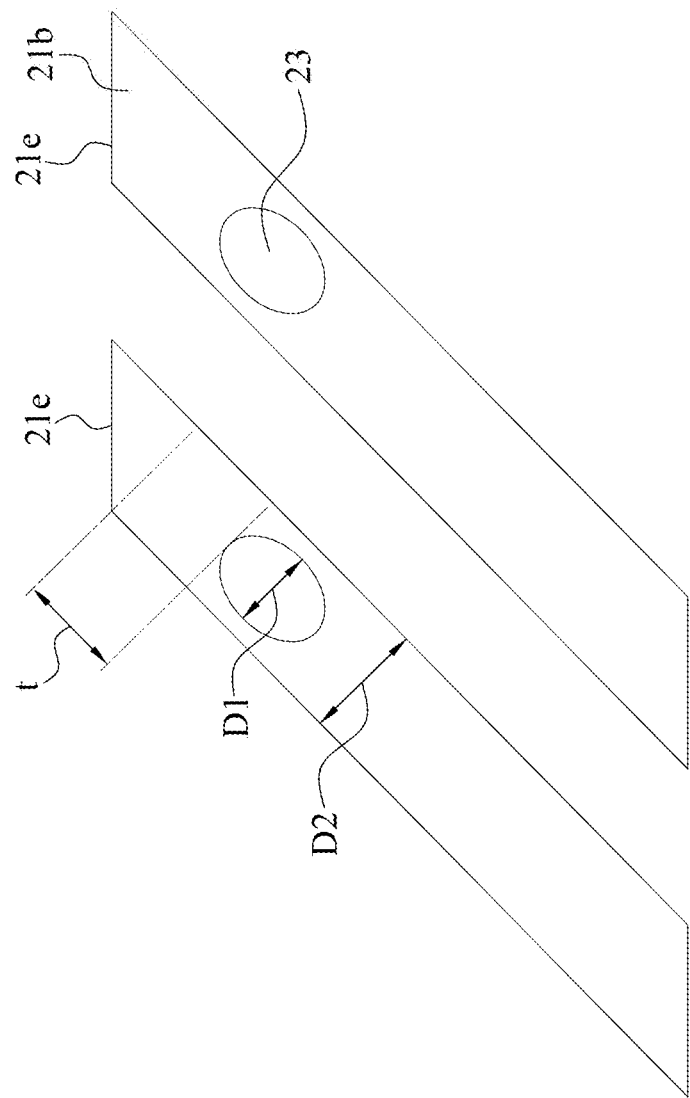
FIG. 5 illustrates

FIG. 5 is a partially enlarged bottom view of two adjacent leads 20 (only inner lead portions and the supporting members thereon are shown). The supporting member 23 is spaced from the distal end 21e of the inner lead portion 21 at a distance t of greater than 0 μm. In some embodiments, the supporting member 23 is spaced from the distal end 21e of the inner lead portion 21 at a distance t of greater than 0 μm, greater than 5 μm, greater than 10 μm, greater than 20 μm, greater than 30 μm, greater than 40 μm, greater than 50 μm, or more. The space between the supporting member 23 and the distal end 21e can prevent an overflow of solder resist material and is thus advantageous to the formation of the supporting member 23. In some embodiments, a width D1 of the supporting member 23 is substantially the same as or smaller than a width D2 of the lower surface 21b of the inner lead portion 21. In some embodiments, the width D2 of the lower surface 21b of the inner lead portion 21 may be 150 μm and the width D1 of the supporting member 23 may be in a range from about 75 μm to about 90 μm. In some embodiments, a space between the supporting member 23 and an edge of the inner lead portion 21 along the width direction is 25 μm or more.

In some embodiments, the supporting member 23 may be in the shape of an ellipse or the like. In some embodiments, the supporting member 23 has a major axis aligned with a longitudinal direction of the inner lead portion. In some embodiments, the lower surface 21b of the inner lead portion 21 includes a plurality of supporting members 23 disposed in a linear arrangement or staggered arrangement along a longitudinal direction of the inner lead portion.

In some embodiments, the lead frame structure has an inner lead pitch of 0.3 mm or less, 0.28 mm or less, 0.25 mm or less, 0.2 mm or less, 0.18 mm or less.

Figure 6:
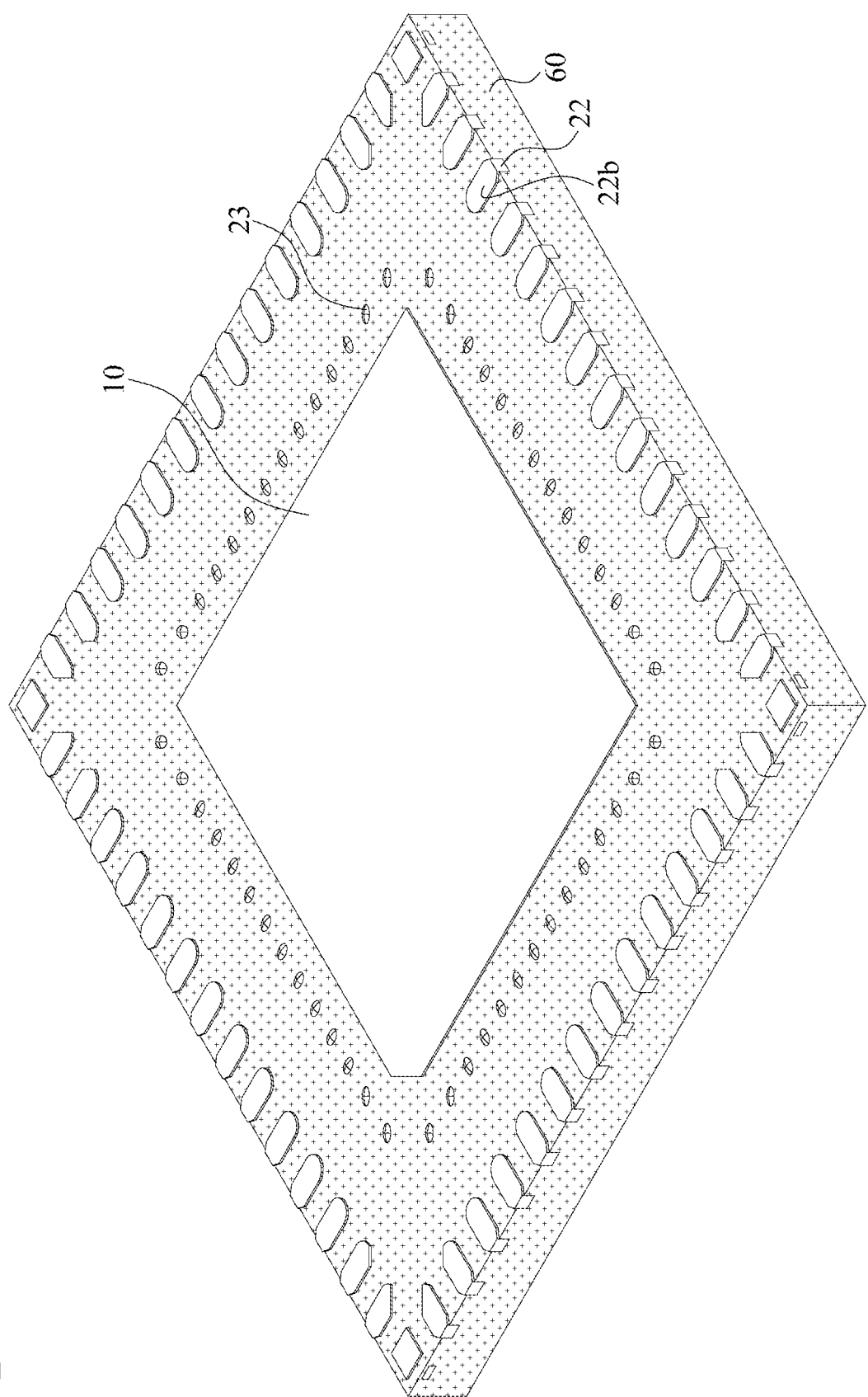
FIG. 6 and FIG. 6A illustrates bottom perspective views of a package structure according to some embodiments of the present disclosure.
Figure 7:
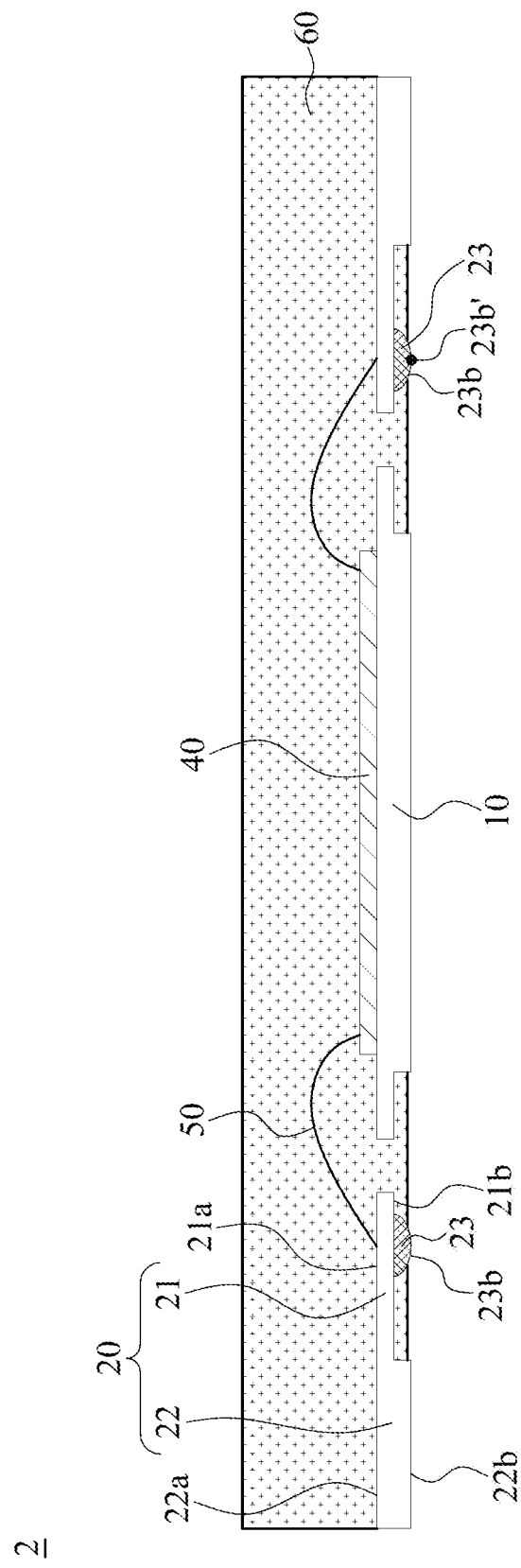
FIG. 7 illustrates a cross-sectional view of the package structure of FIG. 6.

FIG. 6 illustrates a bottom perspective view of a package structure 2 according to some embodiments of the present disclosure. FIG. 7 illustrates a cross-sectional view of the package structure 2 of FIG. 6. The package structure 2 includes a die paddle 10, a plurality of leads 20, a semiconductor die 40 and an encapsulant 60. The semiconductor die 40 is disposed on the die paddle 10. The die paddle 10 and the leads 20 constitute a lead frame which has a structure as discussed above, with respect to the lead frame 1 illustrated in FIGS. 1-5.

The encapsulant 60 covers the semiconductor die 40, the die paddle 10 and the leads 20. Specifically, the encapsulant 60 covers the upper surface 21a of the inner lead portion 21, the upper surface 22a of the outer lead portion 22 and the lower surface 21b of the inner lead portion 21. The lower surface 22b of each of the outer leads 22 is exposed from the encapsulant 60. In some embodiments, the lower surface 60b of the encapsulant 60 is substantially coplanar with the lower surface of the outer leads 22. In some embodiments, the lower surface 60b of the encapsulant 60 may be higher than the lower surface of the outer leads 22.

Figure 6A:
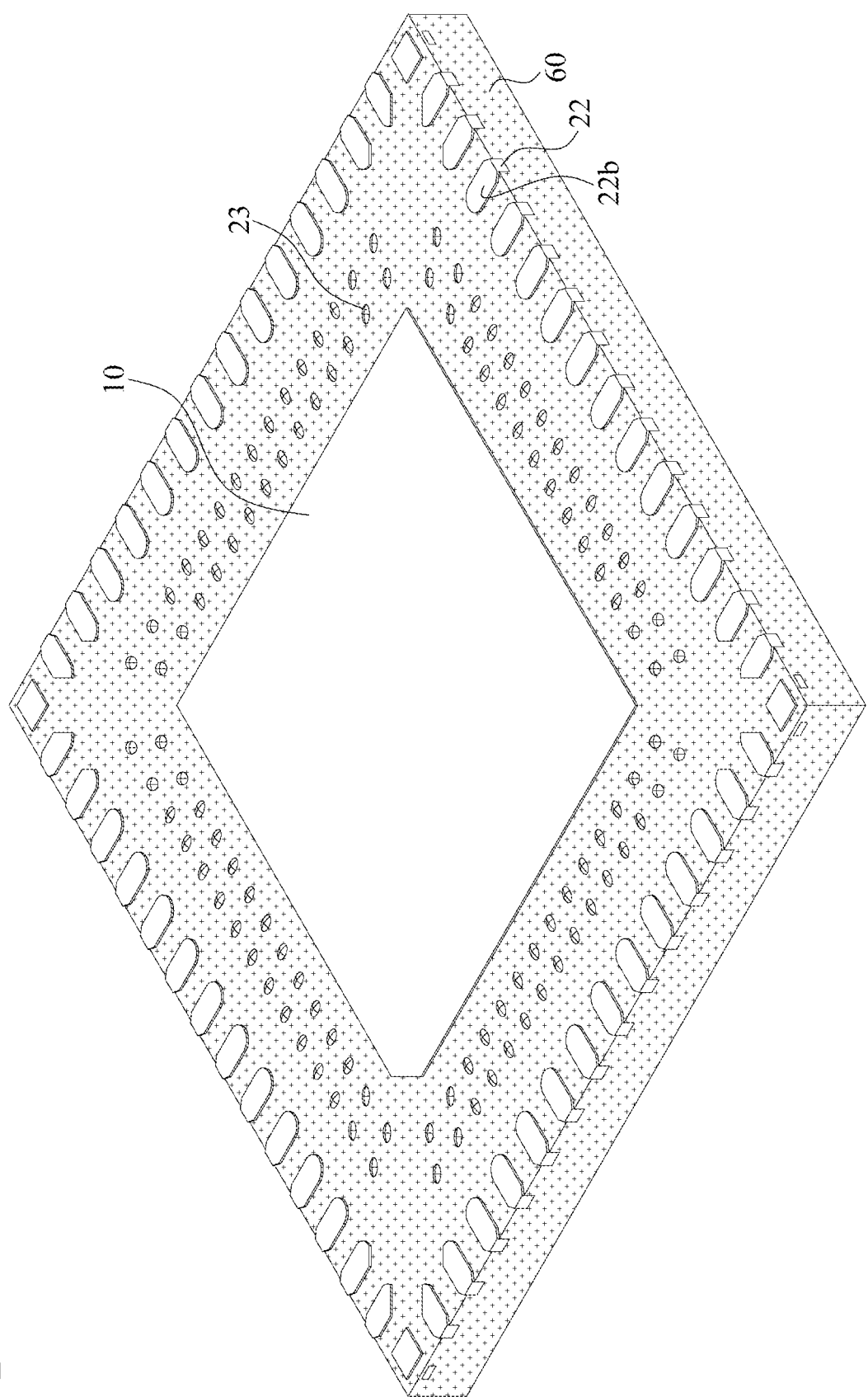

The supporting members 23 are disposed on the lower surface 21b of each of the inner lead portions 21 and are covered by the encapsulant 60. In some embodiments, a portion of the convex surface 23b of the supporting member 23 is exposed from the encapsulant 60. In some embodiments, a top 23b' of the convex surface 23b of the supporting member 23 is exposed from the encapsulant 60. The top 23b' of the convex surface 23b of the supporting member 23 may be substantially coplanar with the lower surface 22b of the outer lead portion 22, as discussed above. In some embodiments shown in FIG. 6 with reference to FIG. 7, the supporting members 23 are disposed in a linear arrangement along a longitudinal direction of the inner lead portion 21. In some other embodiments as shown in FIG. 6A with reference to FIG. 7, the supporting members 23 are disposed in a staggered arrangement along a longitudinal direction of the inner lead portion 21.

In some embodiments, the package structure 2 further includes a plurality of bonding wires 50 for electrically connecting the semiconductor die 40 and the inner lead portion 21 of each of the leads 20. The encapsulant 60 covers the semiconductor die 40, the die paddle 10, the bonding wires 50 and the leads 20.

In some embodiments, a material of the supporting member 23 is different from a material of the encapsulant 60. In some embodiments, the supporting member 23 is a solder resist coating. In some embodiments, the encapsulant 60 may include molding compounds, such as a Novolac-based resin, an epoxy-based resin, a silicone-based resin, or another suitable encapsulant; fillers such as silicon oxide fillers, may be included in the molding compound.

FIG. 8 through FIG. 12 illustrate a method for manufacturing a package structure 2 according to some embodiments of the present disclosure.

Figure 8:
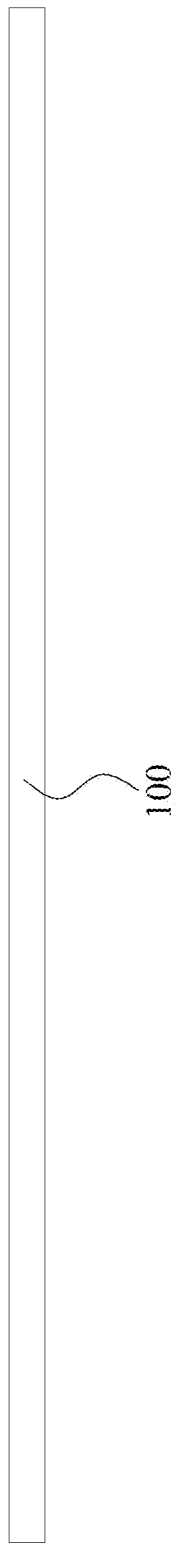
FIG. 8 illustrates one or more stages of an example of a method for manufacturing a package structure according to some embodiments of the present disclosure.

Referring to FIG. 8, a metal plate 100 is provided. In some embodiments, the metal plate 100 may be a copper plate.

Figure 9:
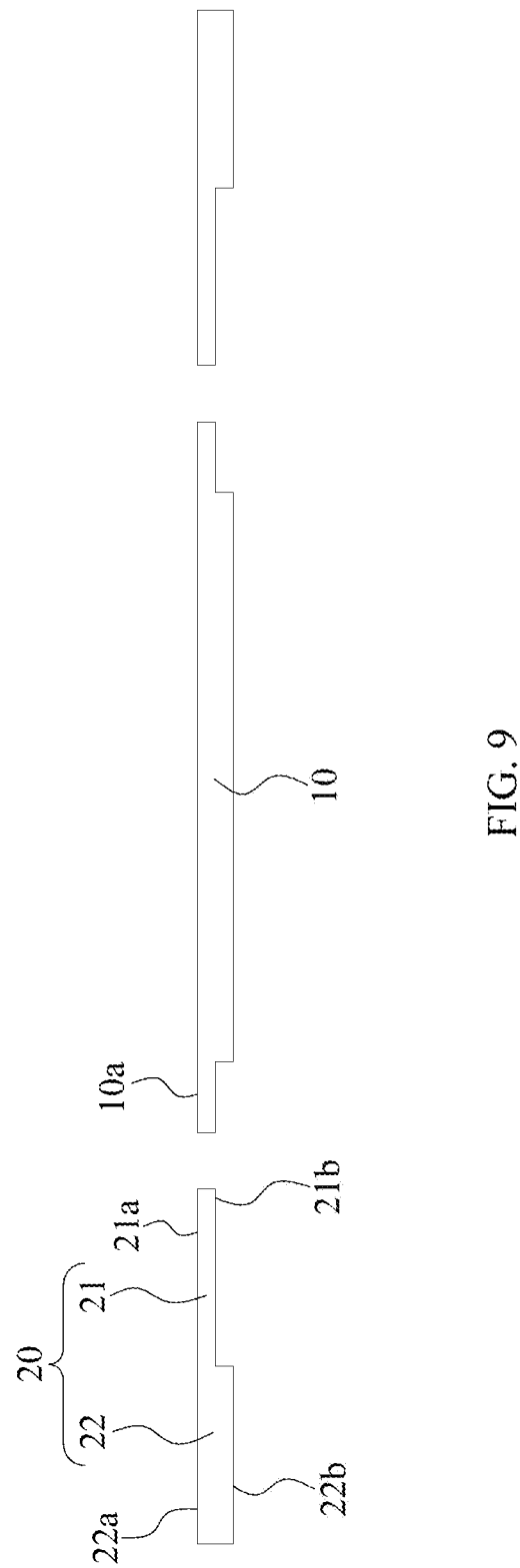
FIG. 9 illustrates one or more stages of an example of a method for manufacturing a package structure according to some embodiments of the present disclosure.

Referring to FIG. 9, the metal plate 100 is etched to form a lead frame including a die paddle 10 and a plurality of leads 20 surrounding the die paddle 10. Each of the leads 20 includes an inner lead portion 21 and an outer lead portion 22 connecting to the inner lead portion 21. The inner lead portion 21 is adjacent to and spaced apart from the die paddle 10. The inner lead portion 21 is thinned by carrying out a half-etching process so that the bottom surface 21b of the inner lead portion 21 is at an elevation higher than the bottom surface 22b of the outer lead portion 22. In some embodiments, the top surface 21a of the inner lead portion 21 is substantially coplanar with the top surface 22b of the outer lead portion 22. In some embodiments, the top surface 21a of the inner lead portion 21, the top surface 22b of the outer lead portion 22 and the top surface 10a of the die paddle are substantially coplanar with each other.

Figure 10:
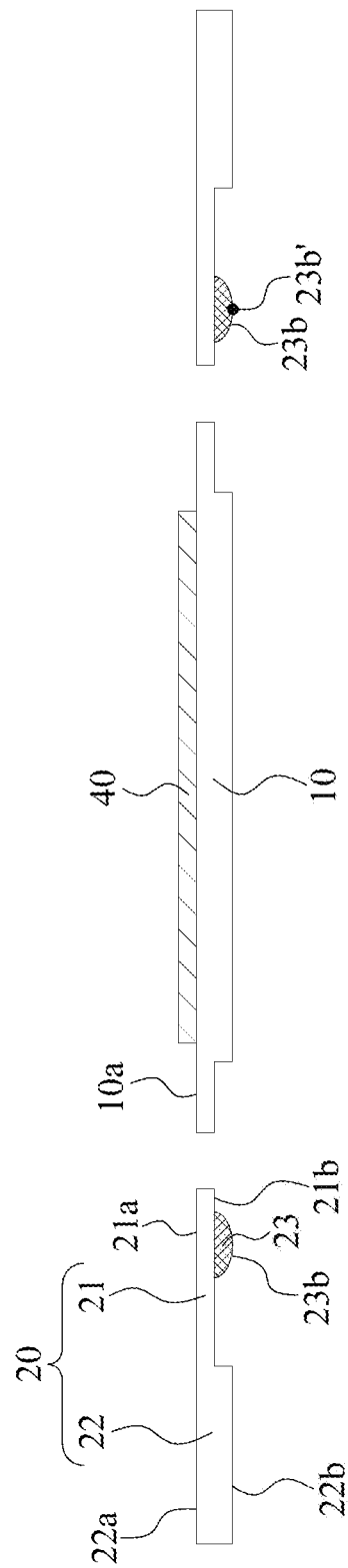
FIG. 10 illustrates one or more stages of an example of a method for manufacturing a package structure according to some embodiments of the present disclosure.

Referring to FIG. 10, a supporting member 23 is formed on a bottom surface 21b of the inner lead portion 21 of each lead 20, and a semiconductor die 40 is disposed on the die paddle 10. The supporting member 23 is formed using a solder resist material. In some embodiments, the solder resist material is spray-coated or ink-jet printed on the bottom surface 21b of the inner lead portion (other techniques may also be used) and then cured to form the supporting member 23. In some embodiments, the resulting supporting member 23 may be in the shape of an ellipse and have a convex surface 23b facing away from the inner lead portion 21. In some embodiments, the thickness of the supporting member 23 can be controlled so that the top 23b' of the convex surface 23b of the supporting member 23 is substantially coplanar with the lower surface 22b of the outer lead portion 22.

Figure 11:
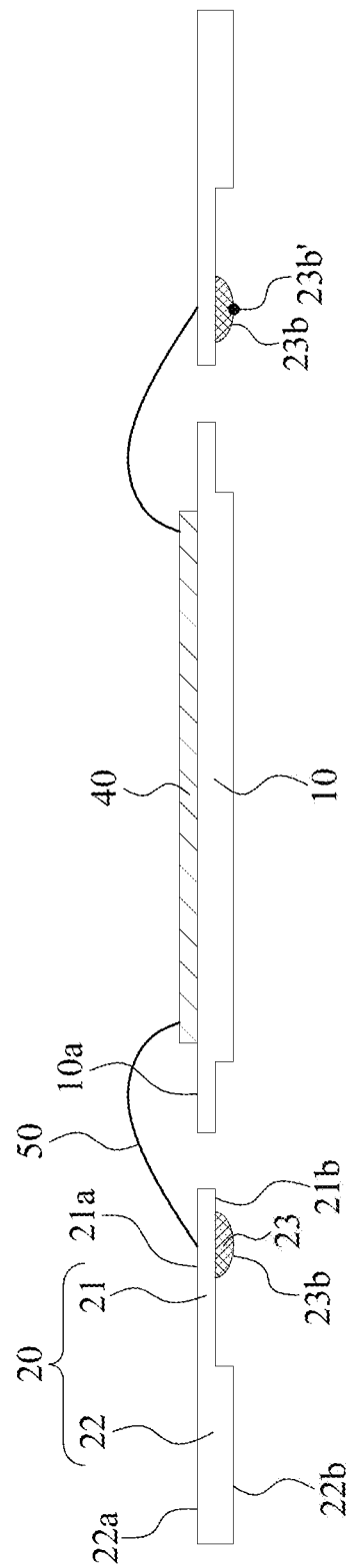
FIG. 11 illustrates one or more stages of an example of a method for manufacturing a package structure according to some embodiments of the present disclosure.

Referring to FIG. 11, a plurality of bonding wires 50 are formed and electrically connect the semiconductor die 40 and the upper bond sections 211 of the inner lead portions 21. In some embodiments, an end of the bonding wire can be attached to the top surface 21a of the inner lead portion 21 and directly above the supporting member 23.

Figure 12:
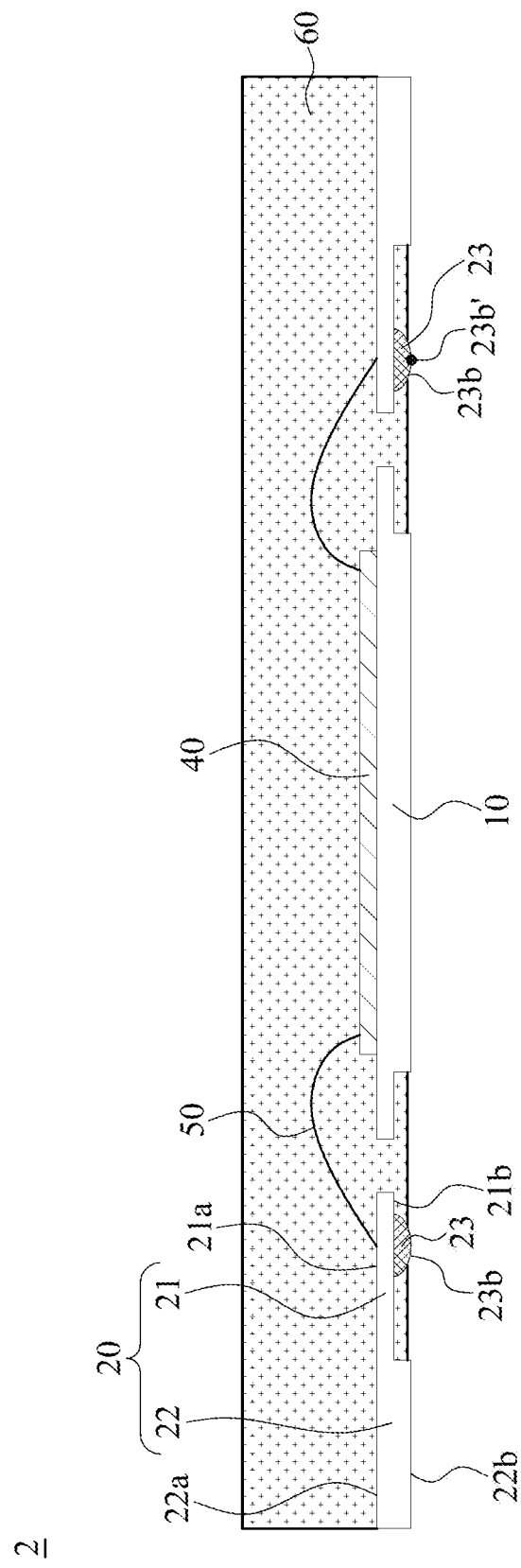
FIG. 12 illustrates one or more stages of an example of a method for manufacturing a package structure according to some embodiments of the present disclosure.

Referring to FIG. 12, an encapsulant 60 is formed to cover the semiconductor die 40, the die paddle 10, the bonding wires 50, the leads 20, and the supporting members 23 and exposes a bottom surface 22a of each of the outer lead portions 22 and a portion of the convex surface 23b of the supporting members 23 (e.g., the top 23b' of the convex surface).

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A leadframe, comprising:
   a die paddle; and
   a plurality of leads surrounding the die paddle, each of the leads including an inner lead portion and an outer lead portion connecting to the inner lead portion,
   wherein the inner lead portion is adjacent to and spaced apart from the die paddle, a bottom surface of the inner lead portion is higher than a bottom surface of the outer lead portion and the bottom surface of the inner lead portion comprises one or more supporting members disposed thereon, and
   wherein the one or more supporting members have a convex surface facing away from the inner lead portion.

2. The leadframe of claim 1, wherein the inner lead portion and the outer lead portion are formed integrally as a monolithic structure.

3. The leadframe of claim 1, wherein an interface is formed between the supporting member and the inner lead portion.

4. The leadframe of claim 1, wherein a top of the convex surface of the supporting member is substantially coplanar with the bottom surface of the outer lead portion.

5. The leadframe of claim 1, wherein the supporting member is disposed close to a distal end of the inner lead portion.

6. The leadframe of claim 1, wherein the supporting member is a solder resist coating.

7. The leadframe of claim 1, wherein a width of the supporting member is substantially the same as or smaller than a width of the bottom surface of the inner lead portion.

8. The leadframe of claim 1, wherein the bottom surface of the inner lead portion comprises a plurality of supporting members disposed in a linear arrangement or staggered arrangement along a longitudinal direction of the inner lead portion.

9. A package structure, comprising:
   a die paddle;
   a semiconductor die disposed on the die paddle;
   a plurality of leads surrounding the die paddle, each of the leads including an inner lead portion and an outer lead portion connecting to the inner lead portion, wherein the inner lead portion is adjacent to and spaced apart from the die paddle, a bottom surface of the inner lead portion is higher than a bottom surface of the outer lead portion, the bottom surface of the inner lead portion comprises one or more supporting members disposed thereon and the one or more supporting members have a convex surface facing away from the inner lead portion; and
   an encapsulant covering the semiconductor die, the die paddle, the leads and the one or more supporting members.

10. The package structure of claim 9, further comprising a plurality of bonding wires for electrically connecting the semiconductor die and the inner lead portion of the leads.

11. The package structure of claim 9, wherein a bottom surface of the outer leads is exposed from the encapsulant.

12. The package structure of claim 11, wherein a portion of the convex surface of supporting member is exposed from the encapsulant.

13. The package structure of claim 11, wherein a top of the convex surface of the supporting member is substantially coplanar with the bottom surface of the outer lead portion.

14. The package structure of claim 9, wherein an interface is formed between the supporting member and the inner lead portion.

15. The package structure of claim 9, wherein the supporting member is disposed close to a distal end of the inner lead portion.

16. The package structure of claim 9, wherein a material of the supporting member is different from a material of the encapsulant.

17. The package structure of claim 9, wherein the bottom surface of the inner lead portion comprises a plurality of supporting members disposed in a linear arrangement or staggered arrangement along a longitudinal direction of the inner lead portion.

18. A method for manufacturing a package structure, comprising:
- (a) providing a leadframe comprising a die paddle and a plurality of leads surrounding the die paddle, each of the leads including an inner lead portion and an outer lead portion connecting to the inner lead portion, wherein the inner lead portion is adjacent to and spaced apart from the die paddle, a bottom surface of the inner lead portion is higher than a bottom surface of the outer lead portion; and
- (b) forming one or more supporting members to a bottom surface of the inner lead portion of each lead, wherein the supporting members are formed by spraying coating and have a convex surface facing away from the inner lead portion.

19. The method of claim 18, wherein after (b), the method further comprises:
- (c) disposing a semiconductor die on the die paddle, and electrically connecting the semiconductor die and the inner lead portions through a plurality of bonding wires; and
- (d) forming an encapsulant to cover the semiconductor die, the die paddle, the bonding wires and the leads, and expose the bottom surface of the outer lead portions.

* * * * *